United States Patent
Neville et al.

(10) Patent No.: US 11,515,129 B2
(45) Date of Patent: Nov. 29, 2022

(54) RADIATION SHIELD MODIFICATION FOR IMPROVING SUBSTRATE TEMPERATURE UNIFORMITY

(71) Applicant: Applied Materials, Inc., Santa Clara, CA (US)

(72) Inventors: Elizabeth Neville, Saratoga, CA (US); Satish Radhakrishnan, San Jose, CA (US); Kartik Shah, Saratoga, CA (US); Vinay Prabhakar, Cupertino, CA (US); Venkata Sharat Chandra Parimi, Sunnyvale, CA (US); Sungwon Ha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/701,986

(22) Filed: Dec. 3, 2019

(65) Prior Publication Data

US 2021/0166921 A1 Jun. 3, 2021

(51) Int. Cl.
*H01J 37/32* (2006.01)
*H01L 21/67* (2006.01)
*H01L 21/687* (2006.01)

(52) U.S. Cl.
CPC .. *H01J 37/32651* (2013.01); *H01J 37/32724* (2013.01); *H01L 21/67248* (2013.01); *H01L 21/68735* (2013.01); *H01L 21/68785* (2013.01)

(58) Field of Classification Search
CPC .......... H01J 37/32651; H01J 37/32724; H01L 21/68735; H01L 21/68785; H01L 21/67248

USPC .......................................................... 438/14
See application file for complete search history.

(56) References Cited

U.S. PATENT DOCUMENTS

| 7,479,621 | B2 * | 1/2009 | Jibb ................. | H01L 21/67109 219/632 |
| 9,490,104 | B2 * | 11/2016 | Yokogawa ........ | H01J 37/32522 |
| 2011/0312103 | A1 * | 12/2011 | Fujimaki .............. | G01N 21/554 436/501 |
| 2012/0193765 | A1 * | 8/2012 | Kelekar ............ | H01L 21/67115 257/629 |
| 2014/0165915 | A1 * | 6/2014 | Raj ................... | H01L 21/68792 118/725 |

* cited by examiner

*Primary Examiner* — Vu A Vu
(74) *Attorney, Agent, or Firm* — Kilpatrick Townsend & Stockton LLP

(57) ABSTRACT

An example semiconductor processing system may include a chamber body having sidewalls and a base. The processing system may also include a substrate support extending through the base of the chamber body. The substrate support may include a support platen configured to support a semiconductor substrate, and a shaft coupled with the support platen. The processing system may further include a plate coupled with the shaft of the substrate support. The plate may have an emissivity greater than 0.5. In some embodiments, the plate may include a radiation shied disposed proximate the support platen. In some embodiments, the plate may include a pumping plate disposed proximate the base of the chamber body. In some embodiments, the emissivity of the plate may range between about 0.5 and about 0.95.

20 Claims, 6 Drawing Sheets

RADIATION SHIELD MODIFICATION FOR IMPROVING SUBSTRATE TEMPERATURE UNIFORMITY

TECHNICAL FIELD

The present technology relates to components and apparatuses for semiconductor manufacturing. More specifically, the present technology relates to chamber components for improving substrate temperature uniformity.

BACKGROUND

Integrated circuits are made possible by processes which produce intricately patterned material layers on substrate surfaces. Producing patterned material on a substrate requires controlled methods for forming and removing material. Many aspects of a processing chamber may impact process uniformity. Even minor discrepancies across the substrate may impact the property of the films on the substrate processed. Thus, there is a need for improved systems and methods that can be used to produce high quality devices and structures. These and other needs are addressed by the present technology.

SUMMARY

Embodiments of the present technology may include semiconductor processing systems. In some embodiments, an exemplary semiconductor processing system may include a chamber body. The chamber body may include sidewalls and a base. The semiconductor processing system may further include a substrate support extending through the base of the chamber body. The substrate support may include a support platen configured to support a semiconductor substrate, and a shaft coupled with the support platen. The semiconductor processing system may further include a plate coupled with the shaft of the substrate support. The plate may have an emissivity greater than 0.5.

In some embodiments, the plate may include a radiation shied disposed proximate the support platen. In some embodiments, the plate may include a pumping plate disposed proximate the base of the chamber body. In some embodiments, the emissivity of the plate may range between about 0.5 and 0.95. In some embodiments, the plate may include at least one of a ceramic material or metal.

In some embodiments, the plate may include an upper surface facing the support platen and a lower surface facing the base of the chamber body. At least one of the upper surface or the lower surface of the plate may include a roughened surface configured to increase the emissivity of the plate. In some embodiments, the roughened surface may extend across at least one of an inner edge region, a middle region, or an outer edge region of the at least one of the upper surface or the lower surface of the plate. In some embodiments, the roughened surface may extend between about 5% and about 100% of a width of the at least one of the upper surface or the lower surface of the plate. In some embodiments, the roughened surface may extend across an entire width of the at least one of the upper surface or the lower surface of the plate.

In some embodiments, the plate may include an upper surface facing the support platen and a lower surface facing the base of the chamber body. At least one of the upper surface or the lower surface of the plate may include a coating configured to affect the emissivity of the plate. In some embodiments, the coating may extend across at least one of an inner edge region, a middle region, or an outer edge region of the at least one of the upper surface or the lower surface of the plate. In some embodiments, the coating may extend between about 5% and about 100% of a width of the at least one of the upper surface or the lower surface of the plate. In some embodiments, the coating may extend across an entire width of the at least one of the upper surface or the lower surface of the plate.

Embodiments of the present technology may include methods of semiconductor processing. In some embodiments, one exemplary method of semiconductor processing may include flowing a precursor into a processing chamber. The processing chamber may include a substrate support on which a substrate may be disposed and a plate below the substrate support. The substrate support may extend through a base of the processing chamber. The substrate support may include a support platen on which the substrate may be disposed, and a shaft coupled with the support platen. The plate may be coupled with the shaft of the substrate support. The plate may have an emissivity greater than 0.5. The method may further include depositing a material on the substrate. A variation in an extinction coefficient of the deposited material may be less than or about 0.2.

In some embodiments, the substrate support may be maintained at a temperature of between about 500° C. and between about 700° C. during the method. In some embodiments, a temperature variation across the substrate may be less than 3° C. during the method. In some embodiments, the plate may include a radiation shied disposed proximate the support platen. In some embodiments, the plate may include a pumping plate disposed proximate the base of the chamber body. In some embodiments, the plate may include at least one of a roughened surface or a coating configured to increase the emissivity of the plate. In some embodiments, the plate may include at least one of a ceramic material or metal. In some embodiments, the method may further include generating a plasma of the precursor within the processing chamber.

The present technology may provide numerous benefits over conventional systems and techniques. For example, by incorporating the radiation shield and/or the pumping plate having increased emissivity, the temperature non-uniformity across the substrate during processing may be substantially reduced. The uniformity in the film thickness, extinction coefficient, and/or various other film properties may be improved. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
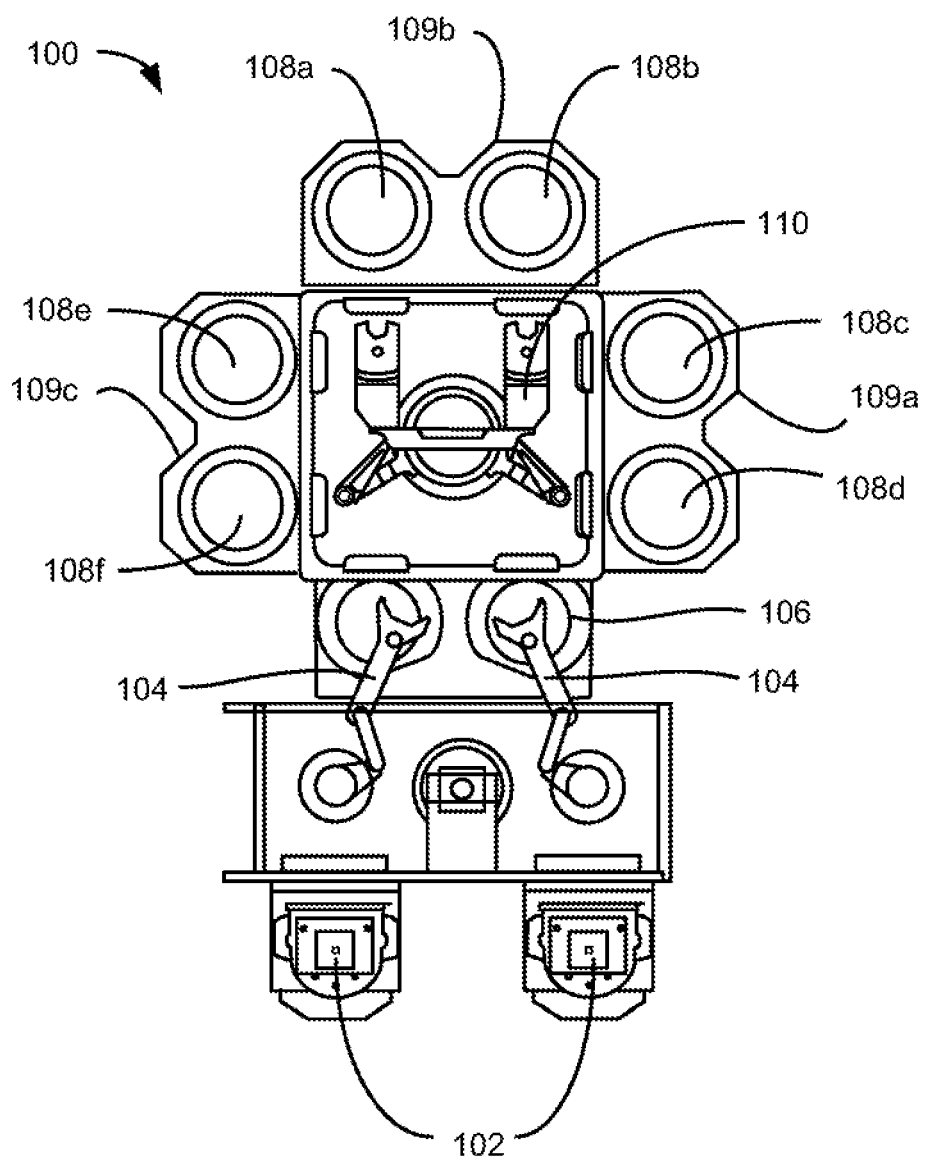
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device features reduce in size, tolerances across a substrate surface may be reduced. Material property differences across a film may affect device realization and uniformity. During processing, temperature variation or non-uniformity across the substrate may impact the properties and/or quality of the film deposited. The temperature of the substrate may be controlled by heating elements embedded in a substrate support on which the substrate may be disposed. Depending on the configuration of the heating elements and/or the substrate support, the substrate may not be uniformly heated, and the temperature across the substrate may vary. The components and/or environment surrounding the substrate and/or the substrate support may also affect heat transfer to the substrate and/or heat loss from the substrate support, and thus affect the temperature uniformity of the substrate. Some properties, such as the extinction coefficient of the film, may be highly correlated to the temperature of the substrate during deposition. Without intending to be bound to a particular theory, when heat may be delivered or lost differently between regions of the substrate, the deposition may be impacted where, for example, warmer portions of the substrate may be characterized by thicker deposition or different film properties, such as higher extinction coefficient, relative to cooler portions. However, uniform extinction coefficient across the entire substrate may be desired in many applications, such as substrate alignment during various lithography processes.

In existing semiconductor processing chambers, heating elements are generally disposed in select zones of the substrate support, such as in an outer zone near an edge of the substrate support. Due to the close proximity to the edge of the substrate support, uniform temperature across the entire substrate may not be achieved via zonal control alone. Although heating zones may be modified to reduce the temperature non-uniformity, changing the heating zones can be costly and may involve designing a new control scheme. Surface modification to the substrate heater may also reduce the temperature non-uniformity. However, modifying the heater surface properties by radius may be difficult to implement in a consistent manner.

The present technology overcomes these issues by incorporating a radiation shield and/or a pumping plate that may have relatively high emissivity values to make the radiation shield and/or the pumping plate more thermally absorptive or transmissive to control the heat loss from the substrate support and the temperature distribution across the substrate. The relatively high emissivity values may be achieved via various surface property modification techniques. By incorporating the radiation shield and/or the pumping plate having relatively high emissivity values, a temperature variation across the substrate may be substantially reduced, which in turn may improve the uniformity of the film thickness, the extinction coefficient of the film, and/or various other properties of the film across the substrate.

Although the remaining disclosure will routinely identify specific processes and/or chambers utilizing the disclosed technology, it will be readily understood that the systems and methods are equally applicable to other semiconductor processes and/or chambers. Accordingly, the technology should not be considered to be so limited as for use with these specific processes or chambers alone. The disclosure will discuss one possible system and chamber according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
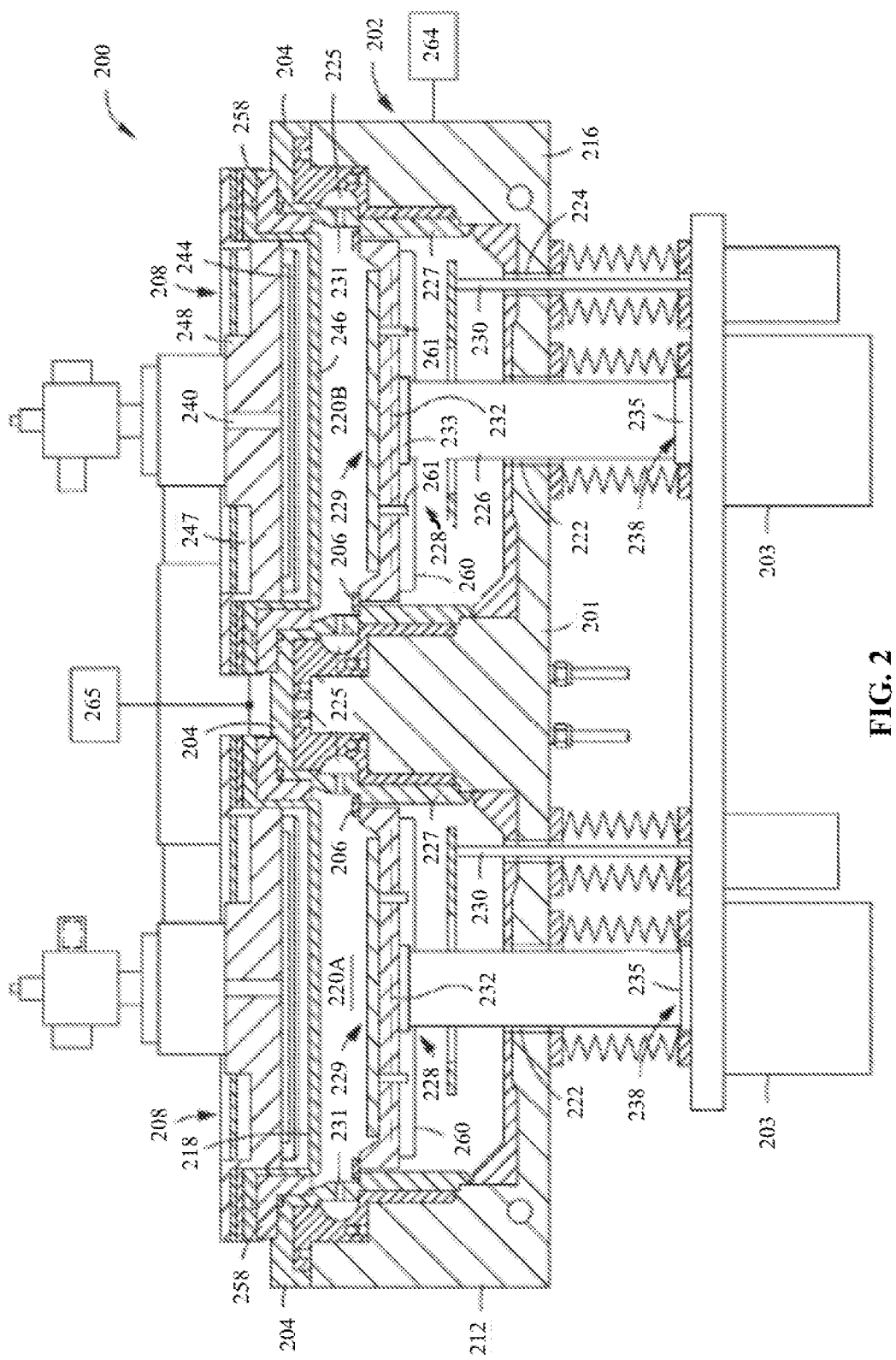
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
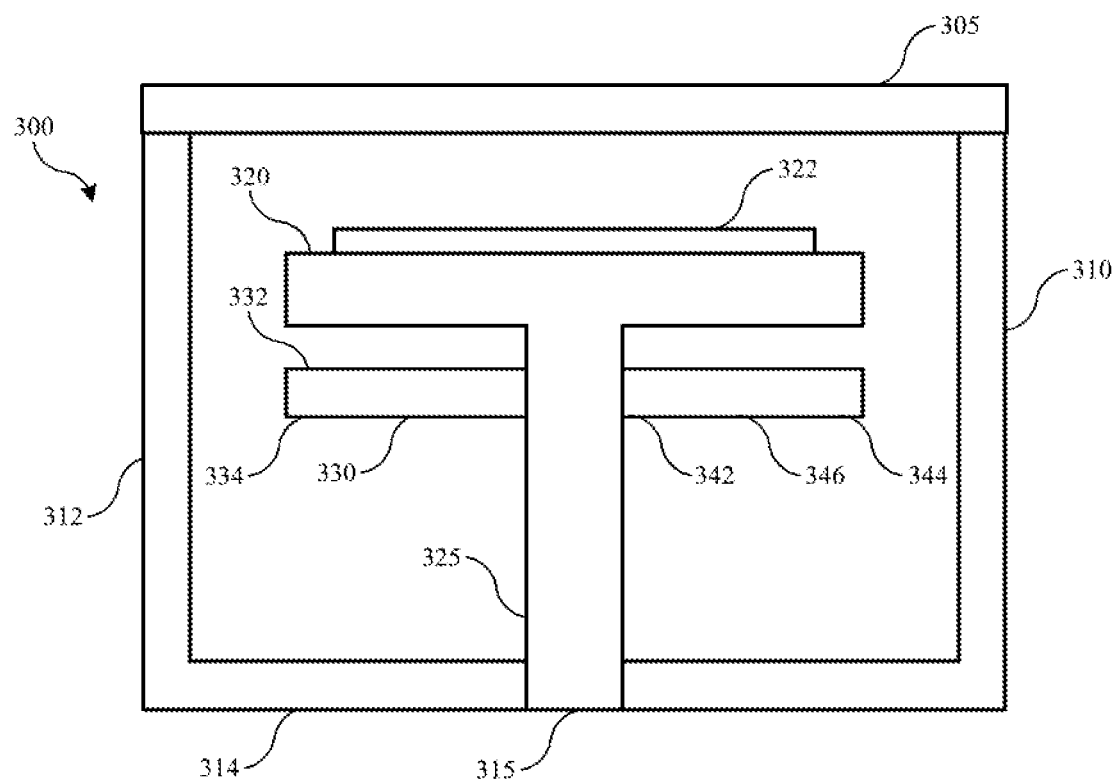
FIG. 3 shows a schematic cross-sectional view of an exemplary processing system according to some embodiments of the present technology.

FIG. 3 shows a schematic partial cross-sectional view of an exemplary processing system 300 according to some embodiments of the present technology. FIG. 3 may illustrate further details relating to components in system 200, such as for pedestal 228. System 300 is understood to include any feature or aspect of system 200 discussed previously in some embodiments. The system 300 may be used to perform semiconductor processing operations including deposition, removal, and cleaning operations. System 300 may show a partial view of the chamber components being discussed and that may be incorporated in a semiconductor processing system. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma within the processing region of the chamber. The faceplate 305 may include any number of apertures. The chamber may also include a chamber body 310, which as illustrated may include sidewalls 312 and a base 314. A pedestal or substrate support 315 may extend through the base 314 of the chamber as previously discussed. The substrate support 315 may include a support platen 320, which may support a semiconductor substrate 322. The support platen 320 may be coupled with a shaft 325, which may extend through the base 314 of the chamber.

As previously explained, achieving temperature uniformity across the entire substrate 322 may be challenging. For processes that may be carried out at higher temperatures, e.g., greater than or about 600° C., heat losses may be substantially greater, and a radial temperature non-uniformity of about 4 to 5° C. may be observed on the substrate 322. The temperature non-uniformity in the substrate 322 may be partly due to the configuration of the substrate support 315 and partly due to the components and/or environment surrounding the substrate 322 and the substrate support 315. For example, to maintain the processing temperatures for various processes, the substrate support 315 may include one or more heating elements configured to produce substrate or platen temperatures that may be greater than or about 500° C., and may be greater than or about 525° C., greater than or about 550° C., greater than or about 575° C., greater than or about 600° C., greater than or about 625° C., greater than or about 650° C., greater than or about 675° C., greater than or about 700° C., greater than or about 725° C., greater than or about 750° C., greater than or about 775° C., greater than or about 800° C., or higher.

However, as mentioned above, the heating elements may only be disposed at select regions or zones of the substrate support 315, such as near the edge of the substrate support 315, although in some embodiments, heating elements may also be disposed near the center of the substrate support 315. There may not be an active temperature control means disposed in the region between the edge and the center regions. Further, while the substrate 322 and aspects of the substrate support 315 may be maintained at higher temperatures, the shaft 325 supporting the substrate support 315 may not be heated, and the chamber body 310 may be maintained at lower temperatures, such as below or about 100° C. or lower, which may all affect the temperature profile across the substrate 322. For example, the center regions of the substrate 322 or substrate support 315 may have a higher losses to the shaft 325, which may lower a substrate temperature about the center of the substrate 322. The edge regions of the substrate 322 or substrate support 315 may have higher losses to the sidewalls 312 of the chamber body 310, which may lower a substrate temperature radially about the substrate 322. Thus, a temperature non-uniformity may be present in the substrate 322, with the region between the edge and the center regions having a slightly higher temperature than the edge and/or the center regions. In some case, a temperature non-uniformity of 4 to 5° C. may be observed. As discussed above, some film properties, such as extinction coefficient, may be highly correlated to the temperature of the substrate 322. Even a temperature non-uniformity of 4 to 5° C. in the substrate 322 may lead to variation in the extinction coefficient, which can be problematic for subsequent lithography or etching operations.

In some embodiments, to control heat loss from the support platen 320 and/or substrate 322, system 300 may also incorporate a plate, more specifically, a radiation shield 330, which may be coupled about or with the shaft 325 of the substrate support 315 and disposed proximate the support platen 320. The radiation shield 330 may include an upper surface 332 facing the support platen 320, a lower surface 334 facing the base 314 of the chamber body 310, an inner edge region 342 proximate the shaft 325, an outer edge region 344 proximate the sidewalls 312 of the chamber body 310, and a middle region 346 disposed between the inner and outer edge regions 332, 334. To effectively improve temperature uniformity across the substrate 322, the radiation shield 330 may be configured to have a relatively high emissivity as will be discussed in more detail below.

Figure 4:
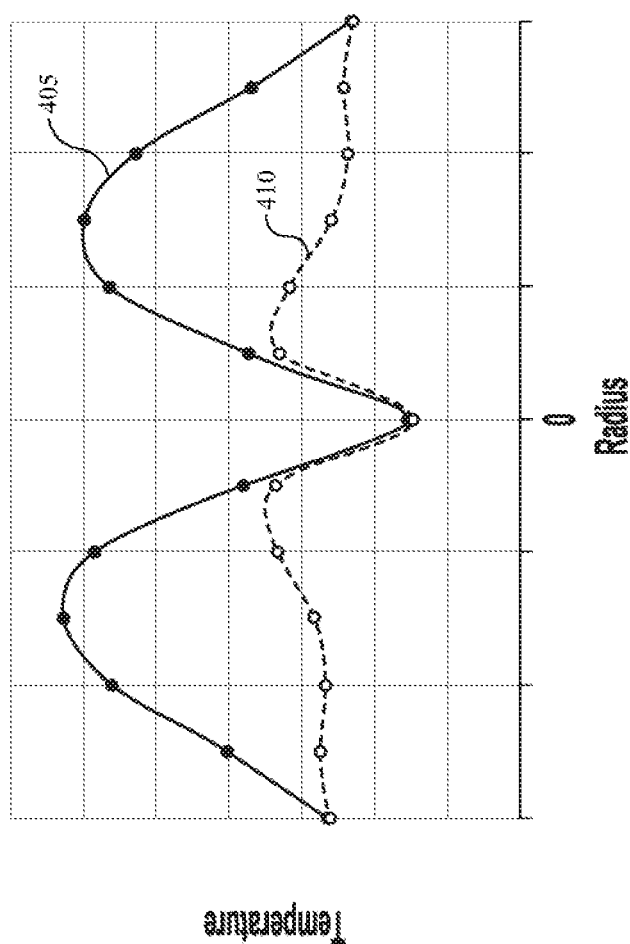
FIG. 4 schematically illustrates exemplary temperature distribution curves of a substrate during processing according to some embodiments of the present technology.

FIG. 4 schematically illustrates exemplary temperature distribution curves of a substrate during processing. Each of curve 405 and curve 410 represents a temperature distribution across the substrate when the substrate may be processed in a chamber system that may incorporate a radiation shield, such as system 300 incorporating the radiation shield 330. Curve 405 represents the temperature distribution across the substrate where the radiation shield may have a relatively low emissivity, e.g., less than or about 0.5. Curve 410 represents the temperature distribution across the substrate where the radiation shield may have a relatively high emissivity, e.g., greater than 0.5, so as to effectively improve temperature uniformity in the substrate. It is noted that curve 405 and curve 410 represent the temperature distributions during substrate processing at relatively high temperatures, e.g., ranging between about 500° C. and about 700° C. or even higher temperatures. For practical reasons, the emissivity values discussed herein may be measured under room temperature for infrared radiation, e.g., radiation having a wavelength ranging between about 3 and about 12 microns, with incident angle between about 20 and about 60 degrees.

As shown by curve 405, at the center of the substrate, the temperature may be lower, which may be partly due to the shaft of the chamber system, such as shaft 325 of system 300, causing conductive heat losses. Additionally, at the edge region, the temperature may also be lower, largely due to radiative heat loss to the cooler chamber walls of the chamber system, such as sidewalls 312 of system 300. Further, in the middle region between the center and the edge regions, the temperature may be higher than the temperatures at the center and/or edge regions of the substrate. The relatively high temperature at the middle region may be due to the relatively less amount of heat loss to the surrounding environment, including the radiation shield with relatively low emissivity, as compared to heat loss to the shaft or chamber walls. Thus, the temperature distribution curve 405 may be M shaped. In some embodiments, the peak temperature may occur midway from the center to the edge of the substrate. Depending on the processing temperature, the difference between the peak temperature and the lowest temperature, which may occur at the center and/or edge regions of the substrate, may be greater than or about 3° C., greater than or about 4° C., greater than or about 5° C., greater than or about 6° C., greater than or about 7° C., greater than or about 8° C., greater than or about 9° C., greater than or about 10° C., or greater. For example, in some embodiments, the processing temperature of the substrate may be set at about 600° C. However, a temperature non-uniformity of at least 4° C. to 5° C. may be present.

When the chamber system may incorporate a radiation shield having a relatively high emissivity, the relatively high emissivity may enhance heat absorption or transmission from the substrate support. As shown by curve 410, although the temperature at the center and/or the edge regions may still be relatively low, the temperature at the middle region between the center and the edge regions may be significantly lower, as compared to the case where no radiation shield may be incorporated as illustrated by curve 405. The significantly lowered temperature in the middle region may be due to heat absorption from the substrate support by the radiation shield having the relatively high emissivity. The temperature non-uniformity thus may be significantly reduced. The temperature variation across the substrate may be less than 3° C., and may be less than or about 2.8° C., less than or about 2.6° C., less than or about 2.4° C., less than or about 2.2° C., less than or about 2° C., less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less.

Although the temperature may still peak near the center region, the temperature variation from the peak temperature to the temperature at the center region may be less than 2° C., and may be less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less. In some embodiments, the temperature variation from the peak temperature to the temperature at the edge region may be less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less. The minimized temperature variation may be achieved when the processing temperature may be set as high as at least or about 500° C., at least or about 550° C., at least or about 600° C., at least or about 650° C., at least or about 700° C., or greater.

Because the peak temperature may occur near or relatively close to the center region, a majority of the substrate area may have a substantially uniform temperature distribution. In some embodiments, the peak temperature may occur within 20% of the radius of the substrate from the center of the substrate. In some embodiments, the peak temperature may occur within 15%, within 10%, or within 5% of the radius of the substrate from the center of the substrate. Thus, the temperature within the substrate area across at least 80%, at least 85%, at least 90%, at least 95%, at least 97%, or at least 99% of the radius of the substrate from the edge toward the center may be substantially uniform. A temperature variation of less than or about 2° C., less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less, may be achieved.

As already mentioned above, to effectively improve the temperature uniformity across the substrate, the radiation shield may have a relatively high emissivity that may be greater than 0.5, and may range between about 0.5 and about 0.95 in various embodiments. In some embodiments, the emissivity of the radiation shield may be greater than or about 0.5, and may be greater than or about 0.55, greater than or about 0.6, greater than or about 0.65, greater than or about 0.7, greater than or about 0.75, greater than or about 0.8, greater than or about 0.85, greater than or about 0.9, greater than or about 0.95, or greater. The relatively high emissivity may allow the radiation shield to be more thermally absorptive, resulting in more heat absorption from the substrate and the substrate support at the middle and/or edge regions, and more uniform temperature distribution as shown by curve 410 may be achieved. In some embodiments, the temperature of the edge and/or center regions of the substrate support and/or the substrate may be further adjusted using one or more of the heating elements disposed at the edge region of the substrate support to achieve overall optimal substrate temperature uniformity.

The relatively high emissivity may be achieved by modifying the surface properties of the radiation shield. In some embodiments, the relatively high emissivity may be achieved by increasing a surface roughness of one or both of the upper surface and/or the lower surface of the radiation shield. In some embodiments, the relatively high emissivity may be achieved by coating one or both of the upper and/or lower surfaces of the radiation shield. The radiation shield may be made of a ceramic material that may have relatively low emissivity. The coating may create a surface that may have an emissivity greater than 0.5, and may create a surface having an emissivity close to 0.95 or close to 1. In some embodiments, the coating may include a ceramic material that may be different from the ceramic material forming the radiation shield, although various other suitable coating materials may be utilized. In some embodiments, the coating may create an oxidized surface for the radiation shield. In some embodiments, the emissivity of the radiation shield may be modified by using a different material to form the radiation shield or to form at least one or more portions of the radiation shield to achieve different emissivity values. For example, in some embodiments, ceramic materials, such as alumina, aluminum nitride, may be used to form the radiation shield or portions of the radiation shield. In some embodiments, instead of ceramic materials, metal, such as aluminum or steel, may be utilized to form the radiation shield or portions of the radiation shield to achieve different emissivity.

Although various techniques or materials are described herein to obtain a relatively high emissivity, in some embodiments, a relatively low emissivity or decreased emissivity may be implemented. For example, in some embodiments, the radiation shield or one or more portions thereof may be modified to obtain a decreased emissivity. Such portions may include regions of the radiation shield that provide a relatively low substrate temperature, such as the regions near the central and edge regions of the substrate. Thus, the inner and/or outer edge regions of the radiation shield may be modified to have a relatively low emissivity to reduce heat loss from the substrate support. In some embodiments, coatings, such as gold, titanium, or other material, may be applied to the inner and/or outer edge regions of the radiation shield to achieve lowered emissivity. In some embodiments, depending on the temperature distribution in the substrate, other regions of the radiation shield may be modified to have a relatively low emissivity. For example, depending on the chamber configuration, an edge-to-edge temperature variation, instead of the center-to-edge temperature variation as shown in FIG. 4, may be present in the substrate. The emissivity may be increased near one edge and may be decreased near the other edge.

In some embodiments, the surface modification may be implemented on both the upper and/or lower surfaces of the radiation shield. In some embodiments, the surface modification may only be implemented on one of the upper and/or lower surfaces of the radiation shield. In some embodiments, the surface modification may be implemented across the entire surface of the upper and/or lower surfaces of the radiation shield. In some embodiments, the surface modification may be implemented at select regions of the upper and/or lower surfaces of the radiation shield. Modifying the entire upper and/or lower surfaces of the radiation shield may allow for ease of manufacturing. Modifying only select regions may allow for fine tuning of the temperature distribution of the substrate support and/or the substrate.

For example, in some embodiments, only the portion of the upper and/or lower surfaces at a middle region of the radiation shield may be modified, whereas the portions of the upper and/or lower surfaces at an outer edge region and/or an inner edge region may not be modified. In some embodiments, only the portion of the upper and/or lower surfaces at the outer edge region may be modified, whereas the portions of the upper and/or lower surfaces at the middle region and/or the inner edge region may not be modified. In some embodiments, only the portion of the upper and/or lower surfaces at the inner edge region may be modified, whereas the portions of the upper and/or lower surfaces at the middle region and/or the outer edge region may not be modified. In some embodiments, the portions of the upper and/or lower surfaces near the inner edge region and the middle region may be modified, whereas the portion of the upper and/or lower surfaces at the outer edge region may not be modified. In some embodiments, the portions of the upper and/or lower surfaces at the middle region and the outer edge region may be modified, whereas the portion of the upper and/or lower surfaces at the inner edge region may not be modified. In some embodiments, the portions of the upper and/or lower surfaces at the inner edge region and at the outer edge region may be modified, whereas the portion of the upper and/or lower surfaces at the middle region may not be modified.

Thus, in some embodiments, the upper and/or lower surfaces across the entire width of the radiation shield, which may be measured as the distance between the inner edge and the outer edge of the radiation shield, may be modified. In some embodiments, only a portion or portions of the upper and/or lower surfaces across a portion or portions of the width of the radiation shield may be modified. In some embodiments, the portion or portions of the upper and/or lower surfaces that may be modified may cumulatively extend greater than or about 5% of the width of the radiation shield, and may extend greater than or about 10%, greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, greater than or about 80%, greater than or about 85%, greater than or about 90%, greater than or about 95%, or about 100% of the width of the radiation shield. The modified portion or portions may extend from the inner edge towards the outer edge, may extend from the outer edge towards the inner edge, and/or may extend in any region or regions between the inner and outer edges. For example, in some embodiments, the modified portion may extend from the inner edge and may extend between about 5% and about 95% of the width of the radiation shield from the inner edge, and may extend between about 10% and about 90%, between about 20% and 80%, between about 30% and about 70%, between about 40% and about 60% of the width of the radiation shield from the inner edge. In some embodiments, the modified portion may extend from the outer edge and may extend between about 5% and about 95% of the width of the radiation shield from the outer edge, and may extend between about 10% and about 90%, between about 20% and 80%, between about 30% and about 70%, between about 40% and about 60% of the width of the radiation shield from the outer edge. In some embodiments, the modified portion may be disposed in a middle region away from the inner and outer edges. The middle region may include or may be an annular zone between about 5% and about 95% of the width of the radiation shield, and may be between about 10% and about 90%, between about 20% and 80%, between about 30% and about 70%, between about 40% and about 60% of the width of the radiation shield in various embodiments.

In some embodiments, the modification may be continuous along the width of the radiation shield. In some embodiments, the modification may not be continuous, and the upper and/or lower surfaces may include multiple modified regions across the width of the radiation shield. Further, in some embodiments, the modification may be continuous at common radii. In some embodiments, the modification may not be continuous at common radii. Thus, some regions may be modified while other regions at common radii may not be modified. The modified regions at common radii may be distributed in an axially symmetrical manner about a central axis of the chamber so as to facilitate uniform heat absorption. For example, in some embodiments a first coating or surface treatment may be applied at an inner region, a second coating or surface treatment may be applied at an outer region, and a third coating or surface treatment may be applied at a middle region, any of which regions may include any of the percentages described above. For example, to lower emissivity at an inner and outer region where the temperature may be lower, a first coating may be applied, which may be the same or different in each region. Gold, titanium, or some other material to reduce emissivity may be applied, while not being applied within the middle region, where higher emissivity may be sought. In the middle region, no treatment, surface roughening, or a coating to increase emissivity may be applied, which may be applied between a coating at the inner and outer regions. This may allow further tuning of the temperature effect radially across the substrate. Additionally, any of these treatments may be applied to either or both sides of the radiation shield in some embodiments.

It should be noted that although in FIG. 4, M shaped temperature distribution profiles are shown indicating a center-to-edge temperature variation, in some embodiments, depending on the chamber configuration, the temperature distribution profiles across the substrate may not be M shaped. For example, the temperature of the substrate may differ from edge to edge or side to side. Consequently, to reduce the edge-to-edge or side-to-side temperature variation, the emissivity of the radiation shield may be modified to differ from edge to edge or differ from side to side. For example, the emissivity may be increased at one edge or one side to achieve a lowered temperature of the substrate and/or the emissivity may be lowered at the other edge or the other side to achieve an increased temperature, which may lead to an overall reduced temperature variation in the substrate.

In some embodiments, the same surface modification technique may be utilized to modify the surface property of the upper and/or lower surfaces of the radiation shield and/or to modify select portions and/or regions of the upper and/or lower surfaces of the radiation shield. In some embodiments, the upper and/or lower surfaces and/or the different portions and/or regions of the upper and/or lower surfaces may be modified using different techniques. For example, in some embodiments, at least one of the upper and/or lower surfaces and/or the different portions and/or regions of the upper and/or lower surfaces may be modified using surface roughening techniques, while at least another one of the upper and/or lower surfaces and/or the different portions and/or regions of the upper and/or lower surfaces may be modified by applying a coating. In some embodiments, although the same surface modification technique may be utilized, different emissivity values may nonetheless be achieved by e.g., using different coatings, using different materials forming the radiation shield or portions thereof, creating different roughness characteristics, etc., at the upper and/or lower surfaces and/or at different portions and/or regions of the radiation shield. Thus, different emissivity values may be achieved at the upper and/or lower surfaces and/or at different portions and/or regions of the radiation shield.

In some embodiments, one or more of the outer edge region, the middle region, and/or the inner edge region of the upper and/or lower surfaces of the radiation shield may have a higher emissivity as compared to the other one or more of the inner edge region, the middle region, and/or the outer edge region of the radiation shield. The difference in the emissivity across the radiation shield may range between greater than or about 0.1, greater than or about 0.15, greater than or about 0.2, greater than or about 0.25, greater than or about 0.3, greater than or about 0.35, greater than or about 0.4, greater than or about 0.45, greater than or about 0.5, or greater. For example, in some embodiments, the middle region of the upper and/or lower surfaces of the radiation shield may have a higher emissivity as compared to the inner and/or outer edge regions of the upper and lower surfaces of the radiation shield. A higher emissivity of the middle region of the radiation shield may allow for more heat absorption from the middle region of the substrate support to lower the temperature of the middle region of the substrate support to be close to the temperature at the center and/or edge regions of the substrate support. In some embodiments, one of the upper and/or lower surfaces of the radiation shield may have a higher emissivity as compared to the other of the upper and/or lower surfaces of the radiation shield. For example, in some embodiments, the upper surface of the radiation shield may have a higher emissivity than the lower surface of the radiation shield, whereas in some embodiments, the lower surface of the radiation shield may have a higher emissivity than the upper surface of the radiation shield.

Figure 5:
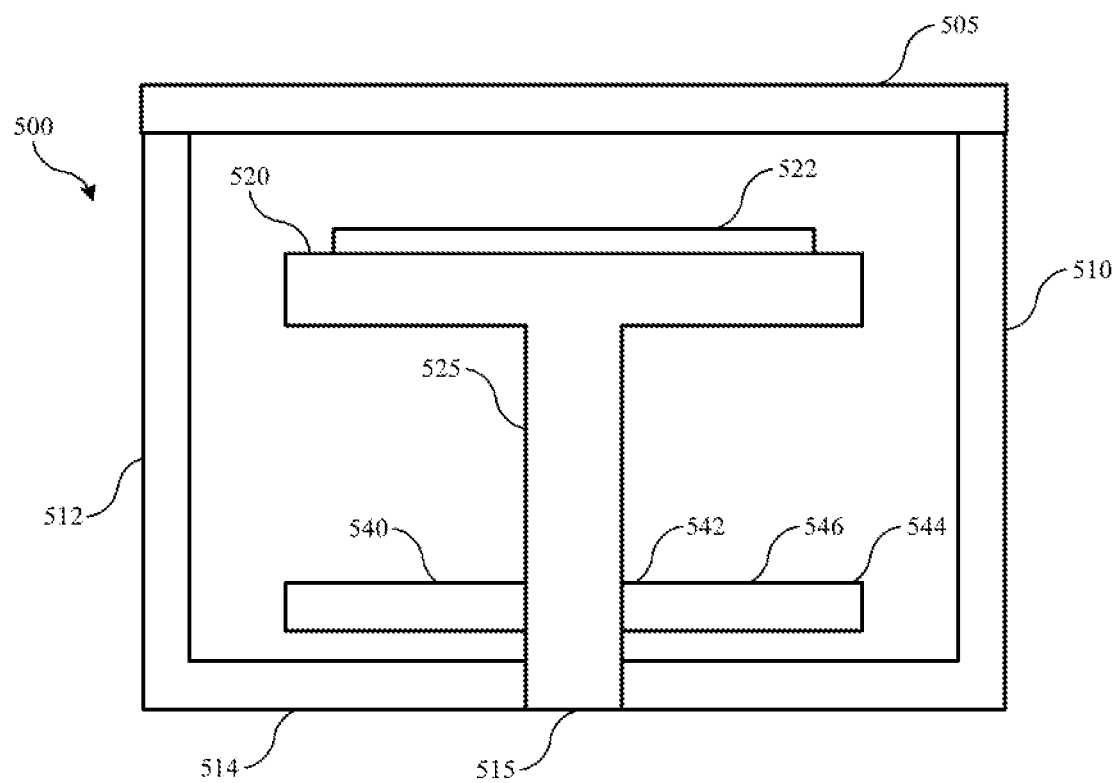
FIG. 5 shows a schematic cross-sectional view of an exemplary processing system according to some embodiments of the present technology.

FIG. 5 shows a schematic cross-sectional view of an exemplary processing system 500 according to some embodiments of the present technology. FIG. 5 may illustrate further details relating to components in system 200. System 500 may include any feature or aspect of system 200 or system 300 discussed previously in some embodiments. Any aspect of system 500 may also be incorporated with other processing chambers or systems as will be readily understood by the skilled artisan. The system 500 may be used to perform semiconductor processing operations including deposition, removal, and cleaning operations.

Similar to system 300, system 500 may include a processing chamber including a faceplate 505, through which precursors may be delivered for processing, and which may be coupled with a power source for generating a plasma within the processing region of the chamber. The faceplate 505 may include any number of apertures. The chamber may also include a chamber body 510, which as illustrated may include sidewalls 512 and a base 514. A pedestal or substrate support 515 may extend through the base 514 of the chamber as previously discussed. The substrate support 515 may include a support platen 520, which may support a semiconductor substrate 522. The support platen 520 may be coupled with a shaft 525, which may extend through the base 514 of the chamber.

Different from system 300, system 500 may include a plate, more specifically, a pumping plate 540, although in some embodiments both a pumping plate and radiation shield may be incorporated within the system. The pumping plate 540 may be made of a ceramic material, although other suitable materials, including metal such as aluminum or steel, may be utilized. The pumping plate 540 may be coupled about or with the shaft 525 of the substrate support 515 and disposed proximate the base 514 of the chamber body 510. The pumping plate 540 may be configured to facilitate the control of heat loss from the support platen 520. Although system 300 and system 500 are described to include the radiation shield 330 and the pumping plate 540, respectively, in some embodiments, a chamber system may include both a radiation shield similar to the radiation shield 300 and a pumping plate similar to the pumping plate 540.

To effectively improve temperature uniformity across the substrate 522, the pumping plate 540 may be configured to have a relatively high emissivity. In some embodiments, the emissivity of the pumping plate 540 may be greater than 0.5, and may range between about 0.5 and 0.95. In some embodiments, the emissivity of the pumping plate 540 may be greater than or about 0.5, and may be greater than or about 0.55, greater than or about 0.6, greater than or about 0.65, greater than or about 0.7, greater than or about 0.75, greater than or about 0.8, greater than or about 0.85, greater than or about 0.9, greater than or about 0.95, or greater.

The relatively high emissivity may be achieved by modifying the properties of the upper and/or lower surfaces of the pumping plate 540. Any of the techniques, examples, or characteristics discussed above for modifying the upper and/or lower surfaces of the radiation shield may be utilized to modify the upper and/or lower surfaces of the pumping plate 540. In some embodiments, the relatively high emissivity may be achieved by increasing a surface roughness of one or both of the upper surface and/or the lower surfaces of the pumping plate 540. In some embodiments, the relatively high emissivity may be achieved by coating one or both of the upper and/or lower surfaces of the pumping plate 540. The coating may create a surface that may have an emissivity greater than 0.5, and may create a surface having an emissivity close to 0.95 or close 1. In some embodiments, the coating may include a ceramic material that may be different from the ceramic material forming the pumping plate 540, although various other suitable coating materials may be utilized. In some embodiments, the coating may create an oxidized surface for the pumping plate 540. In some embodiments, the emissivity of the pumping plate 540 may be modified by using a different material to form the pumping plate 540 or to form at least one or more portions of the pumping plate 540 to achieve different emissivity values. For example, in some embodiments, ceramic materials, such as alumina, aluminum nitride, may be used to form the pumping plate 540 or portions of the pumping plate 540. In some embodiments, instead of ceramic materials, metal, such as aluminum or steel, may be utilized to form the pumping plate 540 or portions of the pumping plate 540 to achieve different emissivity.

Although various techniques or materials are described herein to obtain a relatively high emissivity, in some embodiments, a relatively low emissivity or decreased emissivity may be implemented. For example, in some embodiments, the pumping plate 540 or one or more portions thereof may be modified to obtain a decreased emissivity. Such portions may include regions of the pumping plate 540 that may be proximate substrate regions having relatively low substrate temperatures, such as the regions near the central and edge regions of the substrate. Thus, the inner and/or outer edge regions of the pumping plate 540 may be modified to have a relatively low emissivity to reduce heat loss from the substrate support. In some embodiments, coatings, such as gold, titanium, or other material, may be applied to the inner and/or outer edge regions of the pumping plate 540 to achieve lowered emissivity. In some embodiments, depending on the temperature distribution in the substrate, other regions of the pumping plate 540 may be modified to have a relatively low emissivity. For example, depending on the chamber configuration, an edge-to-edge temperature variation, instead of the center-to-edge temperature variation as shown in FIG. 4, may be present in the substrate. The emissivity may be increased near one edge portion of the pumping plate 540 whereas the emissivity may be decreased near another edge portion of the pumping plate 540 using any of the techniques described herein.

The surface modification may be implemented on both the upper and/or lower surfaces or may be applied to only one of the upper and/or lower surfaces of the pumping plate 540. The modification may be applied across the entire surface of the upper and/or lower surfaces or may be applied across select portions and/or regions of the upper and/or lower surfaces of the pumping plate 540, such as one or more of an inner edge region 542, a middle region 546, and/or an outer edge region 544 of the pumping plate 540, similar to how the surface modification may be applied to one or more of the inner edge region, the middle region, and/or the outer edge region of the radiation shield as discussed above.

Thus, in some embodiments, the upper and/or lower surfaces across the entire width of the pumping plate 540, which may be measured as the distance between an inner edge and an outer edge of the pumping plate 540, may be modified. In some embodiments, only a portion or portions of the upper and/or lower surfaces across a portion or portions of the width of the pumping plate 540 may be modified. In some embodiments, the portion or portions of the upper and/or lower surfaces that may be modified may cumulatively extend greater than or about 5% of the width of the pumping plate 540, and may extend greater than or about 10%, greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, greater than or about 80%, greater than or about 85%, greater than or about 90%, greater than or about 95%, or about 100% of the width of the pumping plate 540. The modified portion or portions may extend from the inner edge towards the outer edge, may extend from the outer edge towards the inner edge, and/or may extend in any region or regions between the inner and outer edges. For example, in some embodiments, the modified portion may extend from the inner edge and may extend between about 5% and about 95% of the width of the pumping plate 540 from the inner edge, and may extend between about 10% and about 90%, between about 20% and 80%, between about 30% and about 70%, between about 40% and about 60% of the width of the pumping plate 540 from the inner edge. In some embodiments, the modified portion may extend from the outer edge and may extend between about 5% and about 95% of the width of the pumping plate 540 from the outer edge, and may extend between about 10% and about 90%, between about 20% and 80%, between about 30% and about 70%, between about 40% and about 60% of the width of the pumping plate 540 from the outer edge. In some embodiments, the modified portion may be disposed in a middle region away from the inner and outer edges. The middle region may include or may be an annular zone extending between about 5% and about 95% of the width of the pumping plate 540, and may extend between about 10% and about 90%, between about 20% and 80%, between about 30% and about 70%, between about 40% and about 60% of the width of the pumping plate 540 in various embodiments.

In some embodiments, the modification may be continuous along the width of the pumping plate 540. In some embodiments, the modification may not be continuous, and the upper and/or lower surfaces may include multiple modified regions across the width of the pumping plate 540. Further, in some embodiments, the modification may be continuous at common radii. In some embodiments, the modification may not be continuous at common radii. Thus, some regions may be modified while other regions at common radii may not be modified. The modified regions at common radii may be distributed in an axially symmetrical manner about a central axis of the chamber so as to facilitate uniform heat absorption.

As already mentioned above, in some embodiments, M shaped temperature distribution profiles may be present in the substrate indicating a center-to-edge temperature variation, whereas in some embodiments, depending on the chamber configuration, the temperature distribution profiles across the substrate may not be M shaped. For example, the temperature of the substrate may differ from edge to edge or side to side. Consequently, to reduce the edge-to-edge or side-to-side temperature variation, the emissivity of the pumping plate 540 may be modified to differ from edge to edge or differ from side to side. For example, the emissivity may be increased at one edge portion or side to achieve a lowered temperature of the substrate and/or the emissivity may be lowered at another other edge portion or side to achieve an increased temperature, which may lead to an overall reduced temperature variation in the substrate.

In some embodiments, the same surface modification technique may be utilized to modify the surface property of the upper and/or lower surfaces of the pumping plate 540 and/or to modify select portions and/or regions of the upper and/or lower surfaces of the pumping plate 540. In some embodiments, the upper and/or lower surfaces and/or the different portions and/or regions of the upper and/or lower surfaces may be modified using different techniques. For example, in some embodiments, at least one of the upper and/or lower surfaces and/or the different portions and/or regions of the upper and/or lower surfaces may be modified using surface roughening techniques, while at least another one of the upper and/or lower surfaces and/or the different portions and/or regions of the upper and/or lower surfaces may be modified by applying a coating. In some embodiments, although the same surface modification technique may be utilized, different emissivity values may nonetheless be achieved by e.g., using different coatings, using different materials forming the pumping plate 540 or portions thereof, creating different roughness characteristics, etc., at the upper and/or lower surfaces and/or at different portions and/or regions of the pumping plate 540. Thus, different emissivity values may be achieved at the upper and/or lower surfaces and/or at different portions and/or regions of the pumping plate 540.

In some embodiments, one or more of the outer edge region 544, the middle region 546, and/or the inner edge region 542 of the upper and/or lower surfaces of the pumping plate 540 may have a higher emissivity as compared to the other one or more of the inner edge region 542, the middle region 546, and/or the outer edge region 544 of the pumping plate 540. The difference in the emissivity across the pumping plate 540 may range between greater than or about 0.1, greater than or about 0.15, greater than or about 0.2, greater than or about 0.25, greater than or about 0.3, greater than or about 0.35, greater than or about 0.4, greater than or about 0.45, greater than or about 0.5, or greater. For example, in some embodiments, the middle region 546 of the upper and/or lower surfaces of the pumping plate 540 may have a higher emissivity as compared to the inner and/or outer regions 542, 544 of the upper and lower surfaces of the pumping plate 540. In some embodiments, the middle region 546 of the upper and/or lower surfaces of the pumping plate 540 may have a lower emissivity as compared to one or both of the inner and/or outer regions 542, 544 of the pumping plate 540. In some embodiments, one of the upper and/or lower surfaces of the pumping plate 540 may have a higher emissivity as compared to the other of the upper and/or lower surfaces of the pumping plate 540. For example, in some embodiments, the upper surface of the pumping plate 540 may have a higher emissivity than the lower surface of the pumping plate 540, whereas in some embodiments, the lower surface of the pumping plate 540 may have a higher emissivity than the upper surface of the pumping plate 540.

By incorporating the pumping plate 540 described herein, the temperature variation across the substrate 522 may be less than 3° C., and may be less than or about 2.8° C., less than or about 2.6° C., less than or about 2.4° C., less than or about 2.2° C., less than or about 2° C., less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less. In some embodiments, the temperature variation from a peak temperature on the substrate 522 to the temperature at the center region may be less than 2° C., and may be less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less. In some embodiments, the temperature variation from the peak temperature to the temperature at the edge region of the substrate may be less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less. The minimized temperature variation may be achieved when the processing temperature may be set as high as at least or about 500° C., at least or about 550° C., at least or about 600° C., at least or about 650° C., at least or about 700° C., or greater.

In some embodiments, although the peak temperature may still occur, such as near or close to the center region of the substrate 522, a majority of the substrate area may have a substantially uniform temperature distribution. In some embodiments, the peak temperature may occur within 20% of the radius of the substrate from the center of the substrate. In some embodiments, the peak temperature may occur within 15%, within 10%, or within 5% of the radius of the substrate from the center of the substrate. Thus, the temperature within the substrate area across at least 80%, at least 85%, at least 90%, at least 95%, at least 97%, or at least 99% of the radius of the substrate 522 from the edge toward the center may be substantially uniform. A temperature variation of less than or about 3° C., less than or about 2.8° C., less than or about 2.6° C., less than or about 2.4° C., less than or about 2.2° C., less than or about 2° C., less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less may be achieved.

By modifying the properties of the upper and/or lower surfaces of the radiation shield and/or the pumping plate to modify the emissivity of the radiation shield and/or the pumping plate, temperature non-uniformity across the substrate during processing may be significantly mitigated. Improved temperature uniformity across the substrate may facilitate uniform film deposition, which may in turn provide uniform extinction coefficient and other improved properties of the film deposited.

Figure 6:
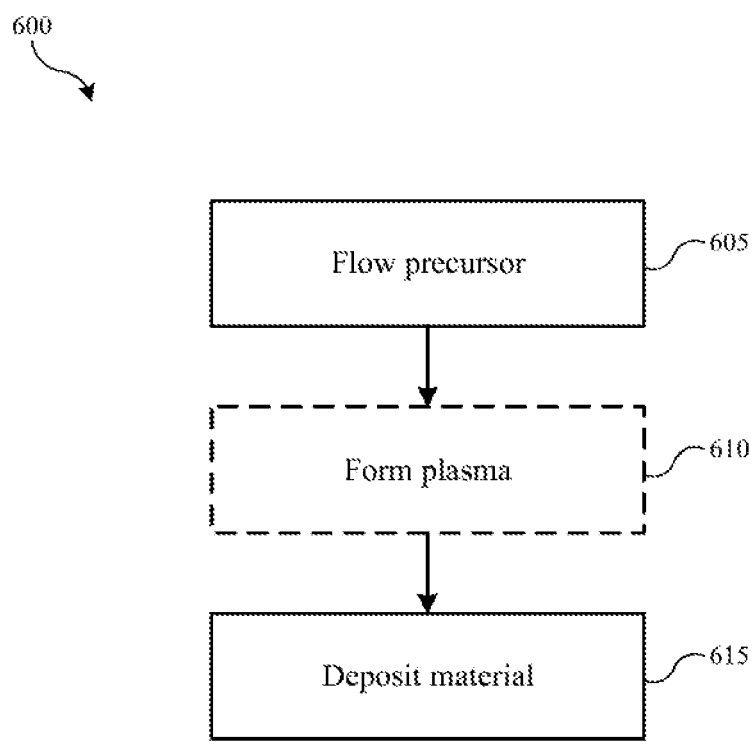
FIG. 6 shows operations of an exemplary method of semiconductor processing according to some embodiments of the present technology.

FIG. 6 shows operations of an exemplary method 600 of semiconductor processing according to some embodiments of the present technology. The method may be performed in a variety of processing chambers, including processing systems 200, 300, 500 described above, which may include radiation shield and/or pumping plate according to embodiments of the present technology, such as the radiation shield 330 and/or the pumping plate 540 discussed previously. Thus, any of the characteristics of the radiation shield and the pumping plate described previously may also be incorporate in the processing chamber for performing the operations of method 600. Method 600 may include a number of optional operations, which may or may not be specifically associated with some embodiments of methods according to the present technology.

Method 600 may include a processing method that may include deposition operations. The method may include optional operations prior to initiation of method 600, or the method may include additional operations. For example, method 600 may include operations performed in different orders than illustrated. In some embodiments, method 600 may include flowing one or more precursors into a processing chamber at operation 605. For example, the precursor may be flowed into a chamber, such as included in systems 200, 300, 500, and may flow the precursor through one or more of a gasbox, a blocker plate, or a faceplate, prior to delivering the precursor into a processing region of the chamber. In some embodiments, method 600 may optionally or additional include, at operation 610, generate a plasma from the one or more precursors within the processing region, such as by providing RF power to the faceplate to generate a plasma. At operation 615, the precursor material, with or without plasma generation, may be deposited on the substrate. During the various operations of method 600, a temperature of the substrate may be maintained at least or about 500° C., at least or about 550° C., at least or about 600° C., at least or about 650° C., at least or about 700° C., or greater.

By incorporating the radiation shield and/or the pumping plate as described herein, a temperature non-uniformity or temperature variation across the substrate of less than or about 3° C., less than or about 2.8° C., less than or about 2.6° C., less than or about 2.4° C., less than or about 2.2° C., less than or about 2° C., less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less, may be achieved. In some embodiments, the temperature variation from a peak temperature on the substrate to the temperature at the center region of the substrate may be less than 2° C., and may be less than or about 1.8° C., less than or about 1.6° C., less than or about 1.4° C., less than or about 1.2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less. In some embodiments, the temperature variation from the peak temperature to the temperature at the edge region of the substrate may be less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less.

Improved temperature uniformity across the substrate may facilitate uniform film deposition, which may in turn provide uniform extinction coefficient and other improved properties of the film deposited. In some embodiments, a variation in the extinction coefficient of the deposited film may be less than or about 0.2, less than or about 0.15, less than or about 0.1, less than or about 0.09, less than or about 0.08, less than or about 0.07, less than or about 0.06, less than or about 0.05, less than or about 0.04, less than or about 0.03, less than or about 0.02, less than or about 0.01, or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system, comprising:
a chamber body comprising sidewalls and a base;
a substrate support extending through the base of the chamber body, wherein the substrate support comprises:
a support platen configured to support a semiconductor substrate, and
a shaft coupled with the support platen; and
a plate coupled with the shaft of the substrate support and separated a distance along the shaft from the support platen, wherein the plate has an emissivity greater than 0.5, wherein at least a portion of one or more surfaces of the plate comprise a surface modification to alter the emissivity of the at least a portion of the one or more surfaces of the plate.

2. The semiconductor processing system of claim 1, wherein the plate comprises a radiation shield disposed proximate the support platen.

3. The semiconductor processing system of claim 1, wherein the plate comprises a pumping plate disposed proximate the base of the chamber body.

4. The semiconductor processing system of claim 1, wherein the emissivity of the plate ranges between about 0.5 and 0.95.

5. The semiconductor processing system of claim 1, wherein the plate comprises an upper surface facing the support platen and a lower surface facing the base of the chamber body, wherein at least one of the upper surface or the lower surface of the plate comprises the surface modification, wherein the surface modification includes a roughened surface configured to increase the emissivity of the plate.

6. The semiconductor processing system of claim 5, wherein the roughened surface extends across at least one of an inner edge region, a middle region, or an outer edge region of the at least one of the upper surface or the lower surface of the plate.

7. The semiconductor processing system of claim 5, wherein the roughened surface extends between about 5% and about 95% of a width of the at least one of the upper surface or the lower surface of the plate.

8. The semiconductor processing system of claim 5, wherein the roughened surface extends across an entire width of the at least one of the upper surface or the lower surface of the plate.

9. The semiconductor processing system of claim 1, wherein the plate comprises an upper surface facing the support platen and a lower surface facing the base of the chamber body, wherein at least one of the upper surface or the lower surface of the plate comprises the surface modification, wherein the surface modification includes a coating configured to increase the emissivity of the plate.

10. The semiconductor processing system of claim 9, wherein the coating extends across at least one of an inner edge region, a middle region, or an outer edge region of the at least one of the upper surface or the lower surface of the plate.

11. The semiconductor processing system of claim 9, wherein the coating extends between about 5% and about 95% of a width of the at least one of the upper surface or the lower surface of the plate.

12. The semiconductor processing system of claim 9, wherein the coating extends across an entire width of the at least one of the upper surface or the lower surface of the plate.

13. The semiconductor processing system of claim 1, wherein the plate comprises at least one of a ceramic material or metal.

14. A method of semiconductor processing, comprising:
flowing a precursor into a processing chamber, wherein the processing chamber comprises a substrate support on which a substrate is disposed and a plate below the substrate support, wherein the substrate support extends through a base of the processing chamber, wherein the substrate support comprises:
a support platen on which the substrate is disposed; and
a shaft coupled with the support platen, wherein the plate is coupled with the shaft of the substrate support, wherein the plate is separated a distance along the shaft from the support platen, and wherein the plate has an emissivity greater than 0.5, wherein at least a portion of one or more surfaces of the plate comprise a surface modification to alter the emissivity of the at least a portion of the one or more surfaces of the plate; and depositing a material on the substrate, wherein a variation in an extinction coefficient of the deposited material is less than or about 0.2.

15. The method of semiconductor processing of claim 14, wherein the substrate support is maintained at a temperature of between about 500° C. and about 700° C. during the method.

16. The method of semiconductor processing of claim 14, wherein a temperature variation across the substrate is less than 3° C. during the method.

17. The method of semiconductor processing of claim 14, wherein the plate comprises a radiation shield disposed proximate the support platen.

18. The method of semiconductor processing of claim 14, wherein the plate comprises a pumping plate disposed proximate the base of the processing chamber.

19. The method of semiconductor processing of claim 14, wherein the surface modification comprises at least one of a roughened surface or a coating configured to increase the emissivity of the plate.

20. The method of semiconductor processing of claim 14, wherein the plate comprises at least one of a ceramic material or metal.

* * * * *